(12) United States Patent
Okumura et al.

(10) Patent No.: US 6,355,573 B1
(45) Date of Patent: Mar. 12, 2002

(54) PLASMA PROCESSING METHOD AND APPARATUS

(75) Inventors: Tomohiro Okumura; Masaki Suzuki; Takuya Matsui, all of Osaka-fu (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/569,056

(22) Filed: May 10, 2000

(30) Foreign Application Priority Data

May 10, 1999 (JP) .......................................... 11-128185

(51) Int. Cl.[7] .............................................. H01L 21/302
(52) U.S. Cl. ................................ 438/709; 118/723 AN; 438/729
(58) Field of Search .................... 118/723 AN; 438/709, 438/710, 707, 729; 343/700 MS; 315/111.51

(56) References Cited

U.S. PATENT DOCUMENTS 6,043,608 A * 3/2000 Samukawa et al. ..... 315/111.51

FOREIGN PATENT DOCUMENTS

JP          8-83696          3/1996

OTHER PUBLICATIONS

29p-H-8, Extended Abstract of the 47th Spring Meeting, 2000, The Japan Society of Applied Physics and Related Societies, issued Mar. 28, 2000, to T. Okumura et al. (Matsushita) and entitled "100MHz Excited Plasma Using $TM_{01}$–mode Patch Antenna and Its Application to Etching".

* cited by examiner

Primary Examiner—Caridad Everhart
(74) Attorney, Agent, or Firm—Wenderoth, Lind & Ponack, L.L.P.

(57) ABSTRACT

A plasma processing method that controls an interior of a vacuum chamber to a specified pressure by introducing gas into the vacuum chamber and evacuating the interior of the vacuum chamber. A high-frequency power having a frequency of 50 MHz to 3 GHz is supplied to a site of an antenna other than its center and periphery with the antenna provided opposite to a substrate in the vacuum chamber, in a state where a general center of the antenna and the vacuum chamber are short-circuited to each other. Meanwhile, the interior of the vacuum chamber is controlled to the specified pressure, and plasma is generated within the vacuum chamber and the substrate placed on a substrate electrode is processed within the vacuum chamber.

25 Claims, 7 Drawing Sheets

MAGNETIC FIELD ----
ELECTRIC FIELD
+ •
CURRENT →

PLASMA PROCESSING METHOD AND APPARATUS

BACKGROUND OF THE INVENTION

The present invention relates to a plasma processing method such as dry etching, sputtering, and plasma CVD, as well as apparatuses therefor, to be used for manufacture of semiconductor or other electron devices and micromachines. More particularly, the present invention relates to plasma processing method and apparatus for use of plasma excited with high-frequency power of VHF or UHF band.

Whereas Japanese Laid-Open Patent Publication No. 8-83696 describes that use of high-density plasma is important in order to meet the trend toward microstructures of semiconductors and other electron devices, low electron temperature plasma has recently been receiving attention by virtue of its high electron density and low electron temperature.

In the case where a gas having a high negativity, i.e., a gas that tends to generate negative ions, such as $Cl_2$ and $SF_6$, is formed into plasma, when the electron temperature becomes about 3 eV or lower, larger amounts of negative ions are generated than with higher electron temperatures. Taking advantage of this phenomenon makes it possible to prevent etching configuration abnormalities, so-called notch, which may occur when positive charges are accumulated at the bottom of micro-patterns due to excessive incidence of positive ions. This allows etching of extreme micro-patterns to be achieved with high precision.

Also, in a case where a gas containing carbon and fluorine, such as CxFy or CxHyFz (where x, y, z are natural numbers), which is generally used for the etching of insulating films such as a silicon oxide film, is formed into plasma, when the electron temperature becomes about 3 eV or lower, gas dissociation is suppressed more than with higher electron temperatures, where, in particular, generation of F atoms, F radicals, and the like,is suppressed. Because F atoms, F radicals, and the like are higher in the rate of silicon etching, insulating film etching can be carried out at larger selection ratios to silicon etching the more with lower electron temperatures.

Also, when the electron temperature becomes 3 eV or lower, ion temperature and plasma potential are also lower, so that ion damage to the substrate in plasma CVD can be reduced.

It is plasma sources using high-frequency power of VHF or UHF band that are now receiving attention as a technique capable of generating plasma having low electron temperature.

FIG. 10 is a sectional view of a dual-frequency excitation parallel-plate type plasma processing apparatus. Referring to FIG. 10, while an interior of a vacuum chamber 1 is maintained to a specified pressure by introducing a specified gas from a gas supply device 2 into the vacuum chamber 1 and simultaneously performing evacuation by a pump 3 as an evacuating device, a high-frequency power of 100 MHz is supplied to a counter electrode 17 by a counter-electrode use high-frequency power supply 16. Then, plasma is generated in the vacuum chamber 1, where plasma processing such as etching, deposition, and surface reforming can be carried out on a substrate 7 placed on a substrate electrode 6. In this case, as shown in FIG. 10, by supplying high-frequency power also to the substrate electrode 6 by a substrate-electrode use high-frequency power supply 8, ion energy that reaches the substrate 7 can be controlled. In addition, the counter electrode 17 is insulated from the vacuum chamber 1 by an insulating ring 18.

However, there has been an issue that the conventional method shown in FIG. 10 has difficulty in obtaining a uniformity of plasma.

FIG. 11 shows results of measuring ion saturation current density at a position 20 mm just above the substrate 7 in the plasma processing apparatus of FIG. 10. Conditions for plasma generation are gas type, a gas flow rate of $Cl_2$=100 sccm, a pressure of 1.5 Pa, and a high-frequency power of 2 kW. It can be understood from FIG. 11 that plasma is biased to one side.

Such nonuniformity of plasma is a phenomenon that could not be seen with a frequency of the high-frequency power of 50 MHz or less. Whereas the 50 MHz or higher high-frequency power needs to be used in order to lower the electron temperature of plasma, there are produced, in this frequency band, not only an advantage that plasma is generated by the counter electrode and the plasma being capacitively or inductively coupled to itself, but also an advantage that the plasma is generated by electromagnetic waves, which are radiated from the counter electrode, propagating on the surface of the plasma. In this frequency band, because the size of the counter electrode and the wavelength of the electromagnetic wave are close to each other, a large number of modes are permitted to be present as an electromagnetic distribution generated in the counter electrode, so that a biased electromagnetic distribution occurs on the counter electrode. On this account, it could be considered, the capacitive or inductive coupling of the counter electrode and the plasma is biased, causing electromagnetic waves radiated from the counter electrode to be also biased, so that plasma is biased.

In view of these issues of the prior art, an object of the present invention is to provide a plasma processing method and apparatus capable of generating uniform plasma.

SUMMARY OF THE INVENTION

In accomplishing these and other aspects, according to a first aspect of the present invention, there is provided a plasma processing method.

The plasma processing method comprises controlling an interior of a vacuum chamber to a specified pressure by introducing gas into the vacuum chamber and evacuating the interior of the vacuum chamber, supplying a high-frequency power having a frequency of 50 MHz to 3 GHz to a site of an antenna other than its center and periphery with the antenna provided opposite to a substrate in the vacuum chamber, in a state where a general center of the antenna and the vacuum chamber are short-circuited to each other, while the interior of the vacuum chamber is controlled to the specified pressure, and generating plasma within the vacuum chamber and processing the substrate placed on a substrate electrode within the vacuum chamber.

According to a second aspect of the present invention, there is provided a plasma processing method according to the first aspect, wherein the high-frequency power having the frequency of 50 MHz to 3 GHz is supplied to the antenna via a through hole provided at a site of a dielectric other than its center and periphery with the antenna provided within the vacuum chamber and with a dielectric sandwiched between the antenna and the vacuum chamber, in a state where the antenna and the vacuum chamber are short-circuited to each other via a through hole provided at a general center of the dielectric.

According to a third aspect of the present invention, there is provided a plasma processing method according to the first aspect, wherein the high-frequency power having the same phase is supplied to a plurality of sites of the antenna which are generally equidistantly spaced around the center of the antenna so as to more uniformity of plasma.

According to a fourth aspect of the present invention, there is provided a plasma processing method.

The plasma processing method comprises controlling an interior of a vacuum chamber to a specified pressure by introducing gas into the vacuum chamber and evacuating the interior of the vacuum chamber, supplying a high-frequency power having a frequency of 50 MHz to 3 GHz to a general center of an antenna with the antenna provided opposite to a substrate in the vacuum chamber, in a state where a site of the antenna other than its center and periphery and the vacuum chamber are short-circuited to each other, while the interior of the vacuum chamber is controlled to the specified pressure, and generating plasma within the vacuum chamber and processing the substrate placed on a substrate electrode within the vacuum chamber.

According to a fifth aspect of the present invention, there is provided a plasma processing method according to the fourth aspect, wherein with the antenna provided within the vacuum chamber and with a dielectric sandwiched between the antenna and the vacuum chamber, the high-frequency power is supplied to the antenna via a through hole provided at a general center of the dielectric, in a state where the antenna and the vacuum chamber are short-circuited to each other via a through hole provided at a site of the dielectric other than its center and periphery.

According to a sixth aspect of the present invention, there is provided a plasma processing method according to the fourth aspect, wherein the high-frequency power having frequency of 50 MHz to 3 GHz is supplied to the general center of the antenna in a state where a plurality of sites of the antenna other than its center and periphery and the vacuum chamber are short-circuited to each other with the plurality of sites being generally equidistantly spaced around the center of the antenna so as to more surely obtain uniformity of plasma.

According to a seventh aspect of the present invention, there is provided a plasma processing method according to the first aspect, wherein the high-frequency power having the frequency of 50 MHz to 3 GHz is supplied to the antenna with a surface of the antenna being covered with an insulating cover.

According to an eighth aspect of the present invention, there is provided a plasma processing method according to the first aspect, wherein the substrate is processed while plasma distribution on the substrate is controlled by an annular and recessed plasma trap provided between the antenna and the vacuum chamber.

According to a ninth aspect of the present invention, there is provided a plasma processing method according to the first aspect, wherein the high-frequency power having the frequency of 50 MHz to 3 GHz is supplied to the antenna while a current on modes in which a current asymmetrical about the center of the antenna flows is blocked by slots provided from the periphery towards the center of the antenna.

According to a tenth aspect of the present invention, there is provided a plasma processing method according to the first aspect, wherein the plasma is generated and the substrate is processed within the vacuum chamber while no DC magnetic fields are present within the vacuum chamber.

According to an eleventh aspect of the present invention, there is provided a plasma processing method.

The method comprises controlling an interior of a vacuum chamber to a specified pressure by introducing gas into the vacuum chamber and evacuating the interior of the vacuum chamber, supplying a high-frequency power having a frequency of 50 MHz to 3 GHz to an antenna provided opposite to a substrate in the vacuum chamber, in a state where an area of the antenna is smaller than an area of the substrate, while the interior of the vacuum chamber is controlled to the specified pressure, and generating plasma within the vacuum chamber and processing the substrate placed on a substrate electrode within the vacuum chamber.

According to a twelfth aspect of the present invention, there is provided a plasma processing apparatus.

The plasma processing apparatus comprises a vacuum chamber, a gas supply device for supplying gas into the vacuum chamber, an evacuating device for evacuating an interior of the vacuum chamber, and a substrate electrode for placing thereon a substrate within the vacuum chamber. The plasma processing apparatus also comprises an antenna provided opposite to the substrate electrode, and a high-frequency power supply for supplying a high-frequency power having a frequency of 50 MHz to 3 GHz to the antenna, wherein a general center of the antenna and the vacuum chamber are short-circuited to each other, and the high-frequency power is supplied to a site of the antenna other than its center and periphery.

According to a thirteenth aspect of invention, there is provided a plasma processing apparatus according to the twelfth aspect, further the comprising a dielectric sandwiched between the antenna and the vacuum chamber, wherein with the antenna provided within the vacuum chamber, the antenna and the vacuum chamber are short-circuited to each other via a through hole provided at a general center of the dielectric. Further, the high-frequency power is supplied to the antenna via a through hole provided at a site of the dielectric other than its center and periphery.

According to a fourteenth aspect of the present invention, there is provided a plasma processing apparatus according to the twelfth aspect, wherein the high-frequency power is supplied to a plurality of sites of the antenna. Further, the sites of the antenna to which the high-frequency power is to be supplied being generally equidistantly spaced around the center of the antenna, and the high-frequency power having the same phase is supplied to the individual sites to which the high-frequency power is to be supplied.

According to a fifteenth aspect of the present invention, there is provided a plasma processing apparatus according to the thirteenth aspect, wherein a size of the antenna, a dielectric constant of the dielectric, and a thickness of a conductor with which the antenna and the vacuum chamber are short-circuited to each other are so designed that an electromagnetic distribution of $TM_{01}$ mode is given to the antenna.

According to a sixteenth aspect of the present invention, there is provided a plasma processing apparatus.

The plasma processing apparatus comprises a vacuum chamber, a gas supply device for supplying gas into the vacuum chamber, an evacuating device for evacuating an interior of the vacuum chamber, and a substrate electrode for placing thereon a substrate within the vacuum chamber.

The plasma apparatus further comprises an antenna provided opposite to the substrate electrode, and a high-frequency power supply for supplying a high-frequency power having a frequency of 50 MHz to 3 GHz to the antenna, wherein a site of the antenna other than its center and periphery and the vacuum chamber are short-circuited to each other, and the high-frequency power is supplied to a generally center of the antenna.

According to a seventeenth aspect of the present invention, there is provided a plasma processing apparatus according to the sixteenth aspect, further comprising a dielectric sandwiched between the antenna and the vacuum chamber, wherein with the antenna provided within the vacuum chamber. Further, the high-frequency power is supplied to the antenna via a through hole provided at a general center of the dielectric, and the antenna and the vacuum chamber are short-circuited to each other via a through hole provided at a site of the dielectric other than its center and periphery.

According to an eighteenth aspect of the present invention, there is provided a plasma processing apparatus according to the sixteenth aspect, wherein the vacuum chamber is short-circuited at a plurality of sites of the antenna, the sites of the antenna at which the vacuum chamber is to be short-circuited being generally equidistantly spaced around the center of the antenna.

According to a nineteenth aspect of the present invention, there is provided a plasma processing apparatus according to the seventeenth aspect, wherein a size of the antenna, a dielectric constant of the dielectric, and a thickness of a conductor with which the high-frequency power is supplied to the antenna are so designed that an electromagnetic distribution of $TM_{01}$ mode is given to the antenna.

According to a twentieth aspect of the present invention, there is provided a plasma processing apparatus according to the twelfth aspect, wherein a surface of the antenna is covered with an insulating cover.

According to a twenty-first aspect of the present invention, there is provided a plasma processing apparatus according to the twelfth aspect, wherein an annular and recessed plasma trap is provided between the antenna and the vacuum chamber.

According to a twenty-second aspect of the present invention, there is provided a plasma processing apparatus according to the twelfth aspect, wherein the antenna is formed into a dome shape convexed away from the substrate.

According to a twenty-third aspect of the present invention, there is provided a plasma processing apparatus according to the twelfth aspect, wherein the antenna is formed into a dome shape convexed toward the substrate.

According to a twenty-fourth aspect of the present invention, there is provided a plasma processing apparatus according to the twelfth aspect, wherein slots are provided from periphery toward center of the antenna.

According to a twenty-fifth aspect of the present invention, there is provided a plasma processing apparatus according to the twelfth aspect, wherein neither a coil nor a permanent magnet for applying a DC magnetic field into the vacuum chamber is provided.

According to a twenty-sixth aspect of the present invention, there is provided a plasma processing apparatus according to the twelfth aspect, wherein the antenna is plate-shaped.

According to a twenty-seventh aspect of the present invention, there is provided a plasma processing apparatus.

The plasma processing apparatus comprises a vacuum chamber, a gas supply device for supplying gas into the vacuum chamber, an evacuating device for evacuating an interior of the vacuum chamber, and a substrate electrode for placing thereon a substrate within the vacuum chamber.

The plasma processing apparatus further comprises an antenna provided opposite to the substrate electrode, and a high-frequency power supply for supplying a high-frequency power having a frequency of 50 MHz to 3 GHz to the antenna, wherein an area of the antenna is smaller than an area of the substrate.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
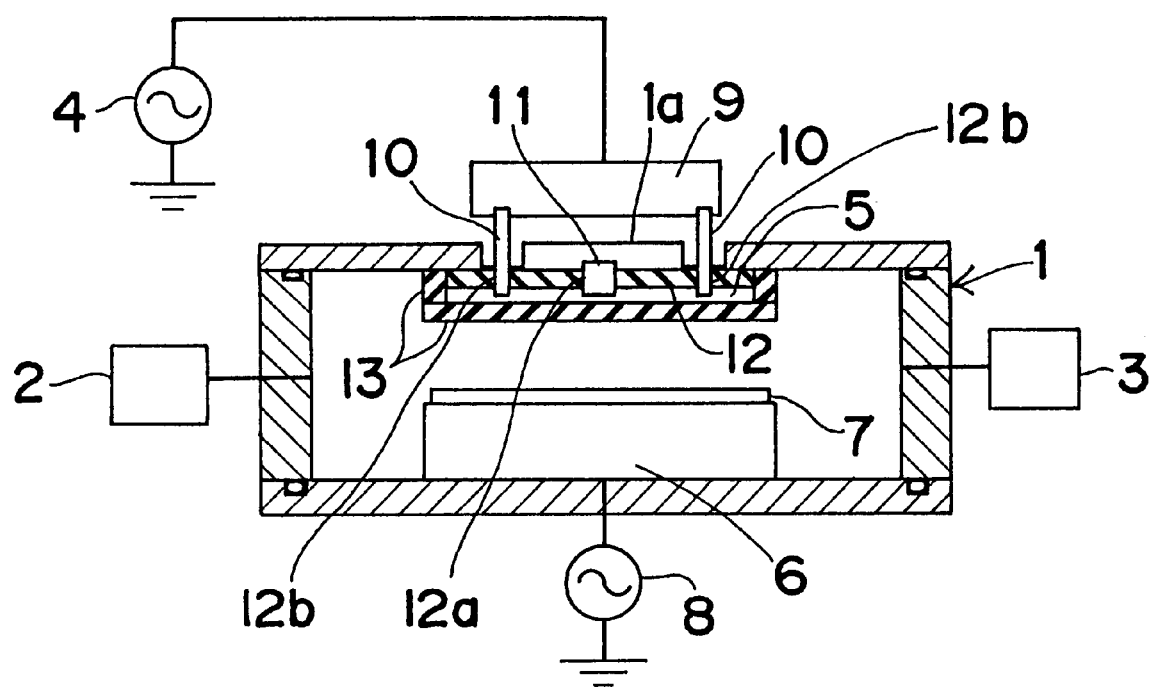
FIG. 1 is a sectional view showing the constitution of a plasma processing apparatus employed in a first embodiment of the present invention.

Before the description of the present invention proceeds, it is to be noted that like parts are designated by like reference numerals throughout the accompanying drawings.

A first embodiment of the present invention is described below with reference to FIGS. 1 to 4.

FIG. 1 shows a sectional view of a plasma processing apparatus employed in the first embodiment of the present invention. Referring to FIG. 1, while an interior of a vacuum chamber 1 is maintained to a specified pressure by introducing a specified gas from a gas supply device 2 into the vacuum chamber 1 and simultaneously performing evacuation by a pump 3 as an evacuating device, a high-frequency power of 100 MHz is supplied to an antenna 5 provided in the vacuum chamber 1 by an antenna use high-frequency power supply 4. Then, plasma is generated in the vacuum chamber 1, where plasma processing such as etching, deposition, and surface reforming can be carried out on a substrate 7 placed on a substrate electrode 6. A substrate-electrode use high-frequency power supply 8 for supplying high-frequency power to the substrate electrode 6 is also provided, so that ion energy that reaches the substrate 7 can be controlled. The high-frequency power to be fed to the antenna 5 is distributed by a distributor 9, so that electric power having the same phase is fed to a plurality of sites of the antenna 5 other than its center and periphery by feed pins 10. Also, a general center of the antenna 5 and a surface 1a of the vacuum chamber 1 opposed to the substrate 7 are short-circuited by a short pin 11. A dielectric 12 is sandwiched between the antenna 5 and the vacuum chamber 1, the feed pins 10 connect the antenna 5 and the distributor 9 to each other, and the short pin 11 connects the antenna 5 and the substrate-opposing surface 1a of the vacuum chamber 1 to each other. The feed pins 10 and the short pin 11 are inserted through holes 12b and 12a provided in the dielectric 12, respectively. Further, the surface of the antenna 5 is covered with an insulating cover 13. As shown in FIG. 1, an area of the antenna 5 is smaller than an area of the substrate 7.

Figure 2:
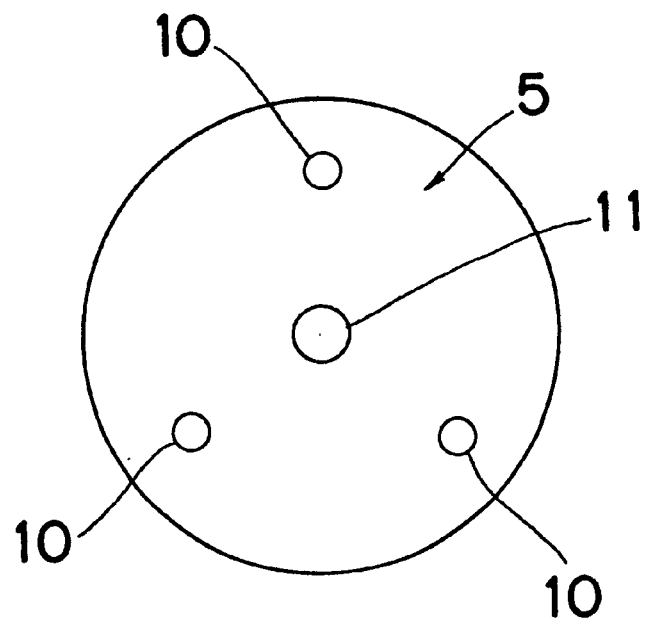
FIG. 2 is a plan view of an antenna employed in the first embodiment of the present invention.

FIG. 2 shows a plan view of the antenna 5. As shown in FIG. 2, the feed pins 10 ore provided at three places, the pins 10 being equidistantly spaced around the center of the antenna 5 so as to more surely obtain uniformity of plasma.

Figure 3:
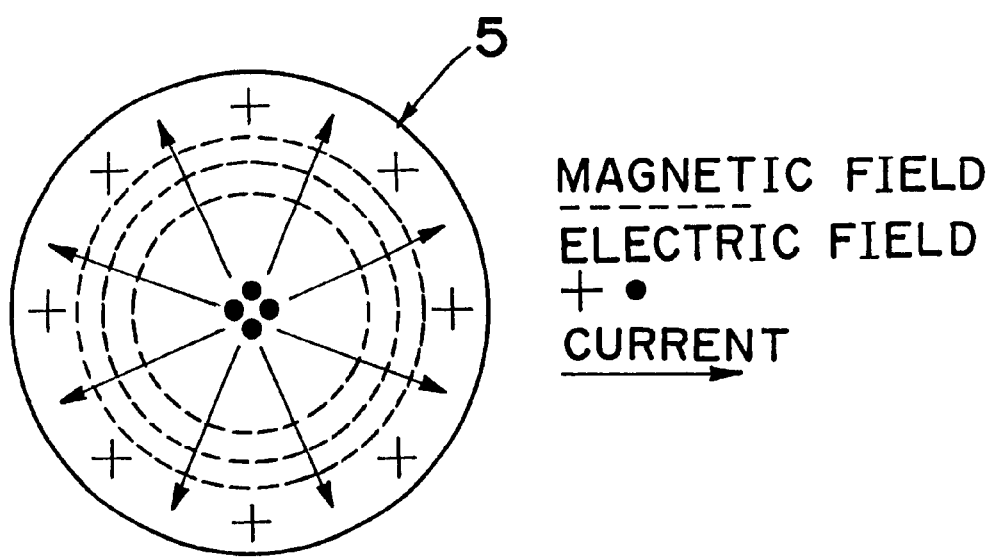
FIG. 3 is a plan view showing an electromagnetic distribution of $TM_{01}$ mode.

The size of the antenna 5, the dielectric constant of the dielectric 12, and the thickness of the short pin 11 are so designed that an electromagnetic distribution of $TM_{01}$ mode is given to the antenna 5. Whereas there are innumerable combinations of a size of the antenna 5, a dielectric constant of the dielectric 12, and a thickness of the short pin 11 that give an electromagnetic distribution of $TM_{01}$ mode to the antenna 5, setting the diameter of the antenna to 5 to 235 mm, the diameter of the short pin to 11 to 23.5 mm and the dielectric constant of the dielectric to 12 to 20, as an example, allows an electromagnetic distribution of $TM_{01}$ mode to be given to the antenna 5. In addition, the electromagnetic distribution of $TM_{01}$ mode has a symmetrical distribution about the center of the antenna 5 as shown in FIG. 3.

Figure 4:
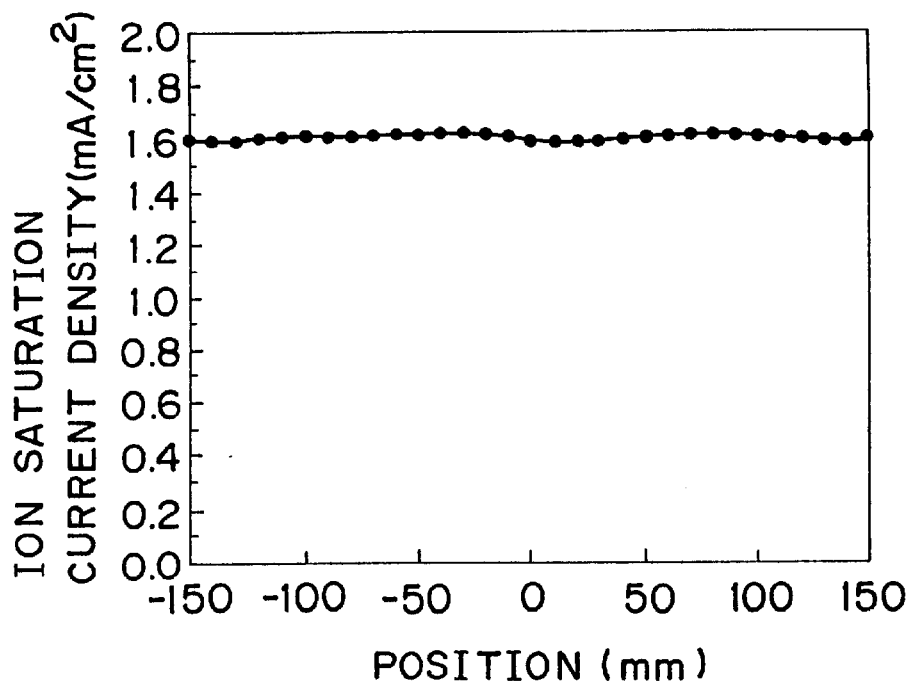
FIG. 4 is a chart showing measuring results of ion saturation current density in the first embodiment of the present invention.
Figure 11:
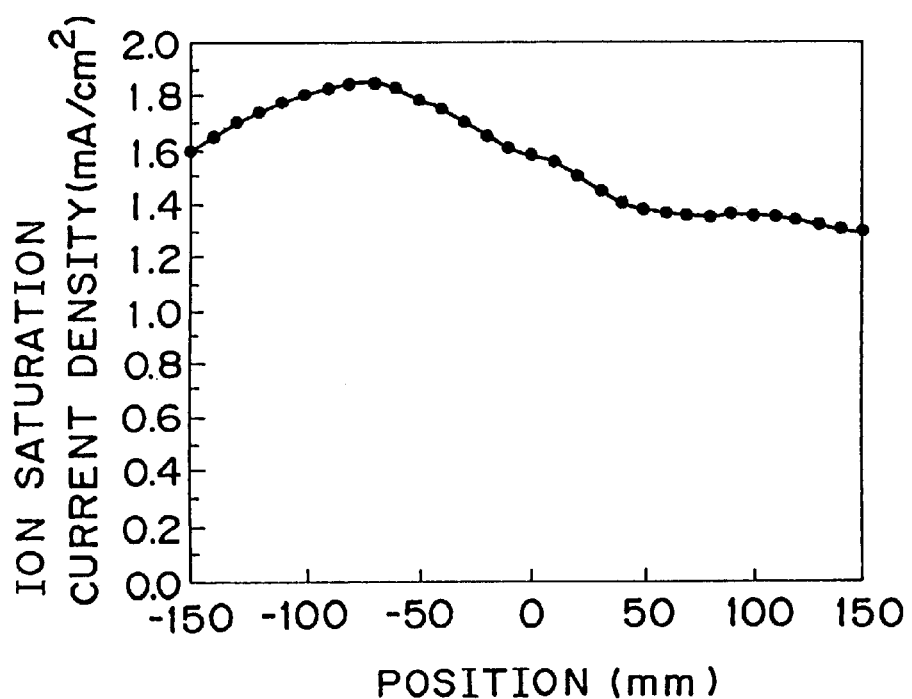
FIG. 11 is a chart showing measuring results of ion saturation current density in the prior art example.

FIG. 4 shows measuring results of ion saturation current density at a position 20 mm just above the substrate 7. Conditions for plasma generation are gas type and gas flow rate of $Cl_2$=100 sccm, a pressure of 1.5 Pa and a high-frequency power of 2 kW. It can be understood from FIG. 4 that uniform plasma is generated without such a bias of plasma as seen in FIG. 11.

Figure 10:
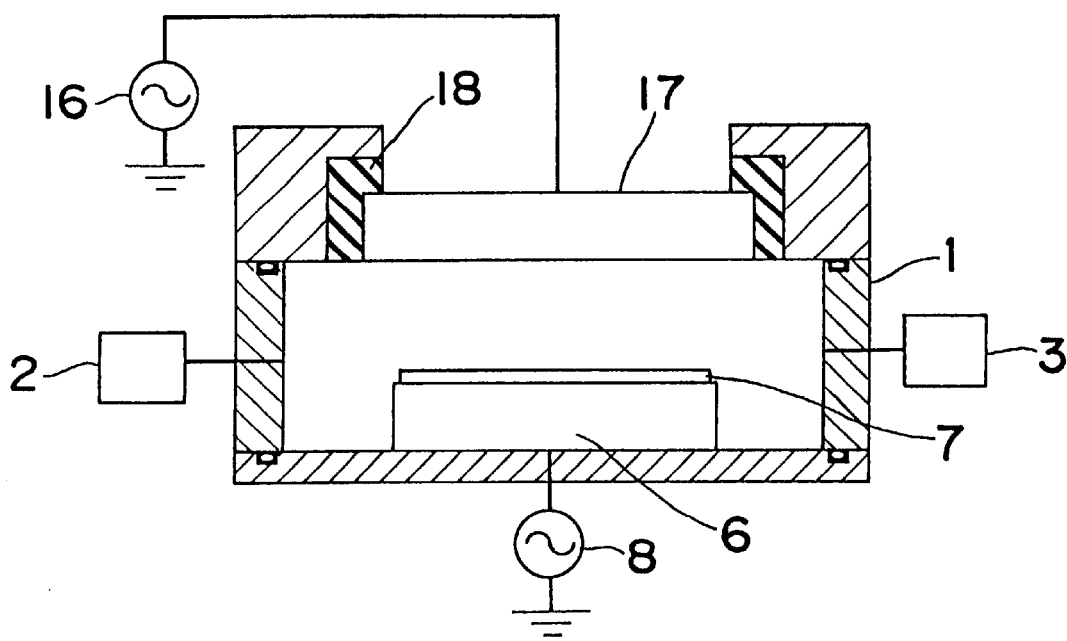
FIG. 10 is a sectional view showing the constitution of a plasma processing apparatus employed in a prior art example.

The reason why the uniformity of plasma is improved as compared with the plasma processing apparatus shown in FIG. 10 of the prior art example is that an electromagnetic distribution of $TM_{01}$ mode is given to the antenna 5. That is, the capacitive or inductive coupling of the antenna 5 and the plasma is generated concentrically about the center of the antenna 5, and electromagnetic waves are radiated symmetrically with respect to the center of the antenna 5.

Although the first embodiment of the present invention has been described above on a case where three feed pins 10 are used to feed the power to the antenna 5, it is also possible to provide one feed pin 10. However, it is desirable that a plurality of feed pins 10 be provided in order to suppress unnecessary electromagnetic distributions other than the $TM_{01}$ mode.

Next, a second embodiment of the present invention is described with reference to FIG. 5.

Figure 5:
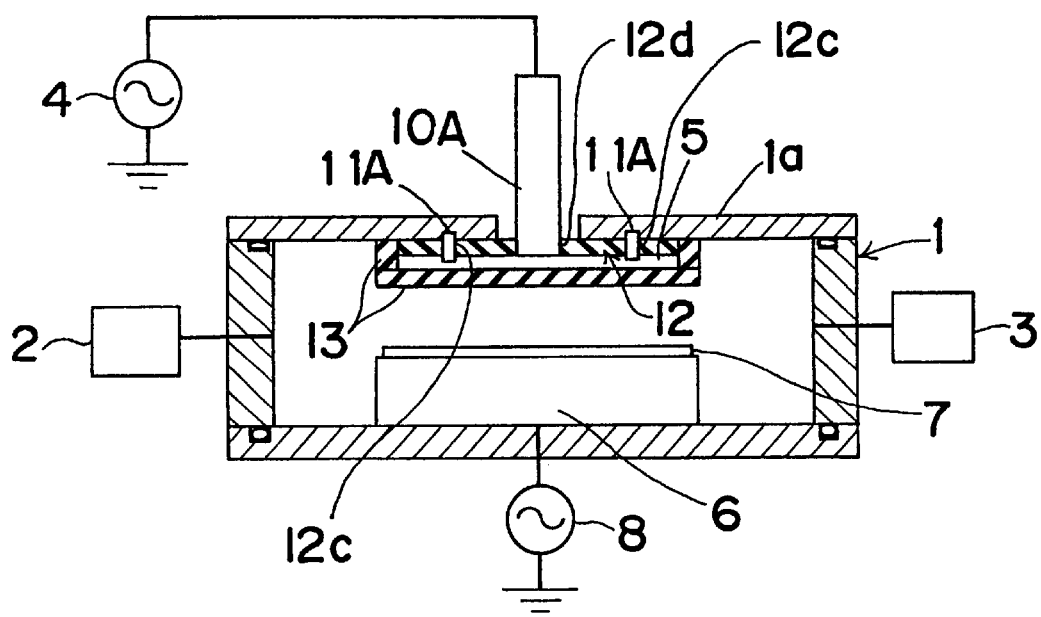
FIG. 5 is a sectional view showing the constitution of a plasma processing apparatus employed in a second embodiment of the present invention.

FIG. 5 shows a sectional view of a plasma processing apparatus employed in the second embodiment of the present invention. Referring to FIG. 5, while the interior of the vacuum chamber 1 is maintained to a specified pressure by introducing a specified gas from the gas supply device 2 into the vacuum chamber 1 and simultaneously performing evacuation by the pump 3 as an evacuating device, a high-frequency power of 100 MHz is supplied to the antenna 5 provided in the vacuum chamber 1 by the antenna use high-frequency power supply 4. Then, plasma is generated in the vacuum chamber 1, where plasma processing such as etching, deposition, and surface reforming can be carried out on the substrate 7 placed on the substrate electrode 6. Further, the substrate-electrode use high-frequency power supply 8 for supplying high-frequency power to the substrate electrode 6 is provided, so that ion energy that reaches the substrate 7 can be controlled. The high-frequency power to be fed to the antenna 5 is fed near the center of the antenna 5 by a feed pin 10A. Also, a plurality of sites of the antenna 5 other than the center and the periphery of the antenna 5 and a surface 1a of the vacuum chamber 1 opposed to the substrate 7 are short circuited by short pins 11A. The dielectric 12 is sandwiched between the antenna 5 and the vacuum chamber 1. The feed pin 10A connects the antenna 5 and the antenna use high-frequency power supply 4 to each other, and the short pins 11A connects the antenna 5 and the substrate-opposing surface 1a of the vacuum chamber 1 to each other. The feed pin 10A and the short pins 11A are inserted into through holes 12d and 12c provided in the dielectric 12, respectively. Further, the surface of the antenna 5 is covered with the insulating cover 13.

The plan view of the antenna 5 is similar to FIG. 2, but the positional relation between the feed pin and the short pin is reversed. That is, the short pins 11A are provided at three places, the short pins 11A being equidistantly spaced around the center of the antenna 5 so as to more surely obtain uniformity of plasma.

The size of the antenna 5, the dielectric constant of the dielectric 12, and the thickness of the feed pin 10A are so designed that an electromagnetic distribution of $TM_{01}$ mode is given to the antenna 5. Whereas there are innumerable combinations of a size of the antenna 5, a dielectric constant of the dielectric 12, and a thickness of the feed pin 10 that give an electromagnetic distribution of $TM_{01}$ mode to the antenna 5, setting the diameter of the antenna to 5 to 235 mm, the diameter of the feed pin to 10 to 23.5 mm, the dielectric constant of the dielectric to 12 to 20, and the diameter of the short pin 11 to 5 mm, as an example, allows an electromagnetic distribution of $TM_{01}$ mode to be given to the antenna 5.

Also in the second embodiment of the present invention, uniform ion saturation current density without any bias is able to be obtained as in FIG. 4.

The reason why the uniformity of plasma is improved like this as compared with the plasma processing apparatus shown in FIG. 10 of the prior art example is that an electromagnetic distribution of $TM_{01}$ mode is given to the antenna 5. That is, the capacitive or inductive coupling of the antenna 5 and the plasma is generated concentrically about the center of the antenna 5, and electromagnetic waves are radiated symmetrically with respect to the center of the antenna 5.

Although the second embodiment of the present invention has been described above on a case where three short pins 11 are used to short-circuit the antenna 5 and the vacuum chamber 1 to each other, it is also possible to provide one short pin 11. However, it is desirable that a plurality of short pins 11 be provided in order to suppress unnecessary electromagnetic distributions other than the $TM_{01}$ mode.

The foregoing embodiments of the present invention as described above are given only by way of example as part of many variations as to the configuration of the vacuum chamber, the configuration and arrangement of the antenna, the configuration and arrangement of the dielectric, and the like, within the application scope of the present invention. It is needless to say that the present invention may be applied in other various ways besides the examples given above.

Also, the foregoing embodiments of the present invention have been described in a case where a high-frequency power of 100 MHz is supplied to the antenna. However, the frequency is not limited to this and the present invention is effective for plasma processing methods and apparatuses using frequencies of 50 MHz to 3 GHz.

Also, the foregoing embodiments have been described in a case where a dielectric is sandwiched between the antenna and the vacuum chamber, and a feed pin or feed pins and a short pin or short pins connect the antenna and either one of the distributor, and the vacuum chamber, and the antenna use high-frequency power supply to each other via a through hole or through holes provided in the dielectric. However, an apparatus in which the dielectric is made up of a plurality of divided members, an apparatus in which electric power is fed by using electromagnetic coupling, and other apparatuses are also possible. Such constitutions can also be construed as included within the application scope of the present invention.

Also, the foregoing embodiments of the present invention have been described in a case where the size of the antenna, the dielectric constant of the dielectric, and the thickness of the short pin or the feed pin are so designed that an electromagnetic distribution of $TM_{01}$ mode is given to the antenna. However, in a case where the thickness of the dielectric is enough large and the frequency band of the antenna is wide, it is not necessary to make a strict design so as to excite the $TM_{01}$ mode. That is, a wide range of values are permitted as the size of the antenna, the dielectric constant of the dielectric, and the thickness of the short pin or the feed pin.

Also, the foregoing embodiments of the present invention have been described in a case where the surface of the antenna is covered with an insulating cover. However, the insulating cover may be omitted. Nevertheless, because of a possibility that without the insulating cover, there may arise issues such as contamination of the substrate due to substances constituting the antenna, it is better that an insulating cover be provided for contamination-sensitive processes. Furthermore, because the ratio of capacitive coupling of the antenna and the plasma increases without the insulating cover so that the plasma density in the center portion of the substrate tends to increase, there are some cases, depending on gas type and gas pressure used, where more uniform plasma distribution can be obtained without the insulating cover than with the insulating cover.

Figure 6:
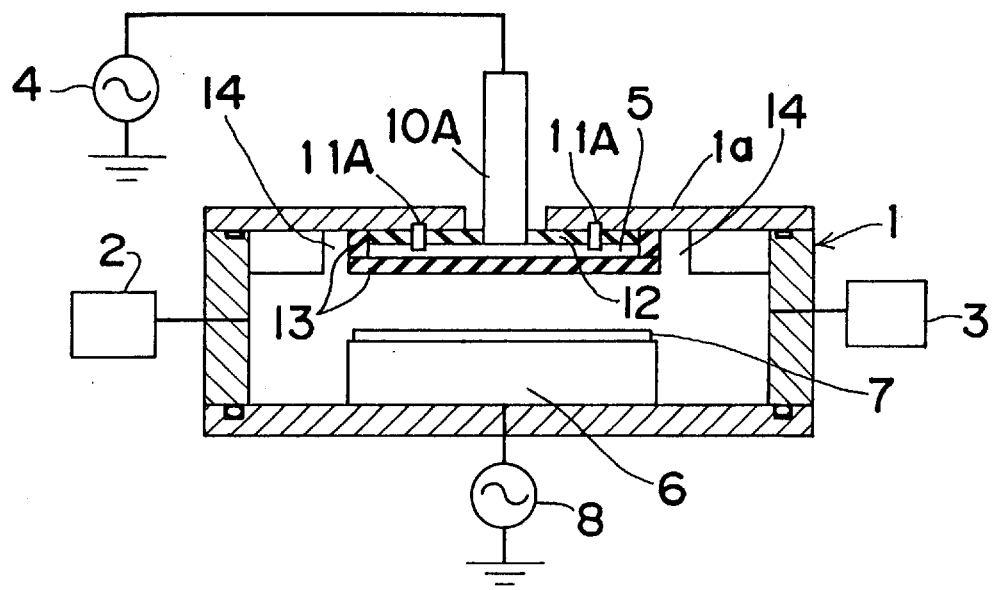
FIG. 6 is a sectional view showing the constitution of a plasma processing apparatus employed in a third embodiment of the present invention.

Also, the foregoing embodiments of the present invention have been described in a case where no space surrounded by solid surfaces is present near the antenna. However, as in a third embodiment of the present invention shown in FIG. 6, an annular and recessed plasma trap 14 may be provided between the antenna 5 and the vacuum chamber 1. In such a constitution, because electromagnetic waves radiated from the antenna 5 are intensified by the plasma trap 14, and because hollow cathode discharge is liable to occur at low electron temperatures, it becomes easier to generate high-density plasma (hollow cathode discharge) with the plasma trap 14 surrounded by solid surfaces. Therefore, within the vacuum chamber 1, the plasma density becomes the highest at the plasma trap 14, and the plasma is transported up near the substrate 7 by diffusion, by which more uniform plasma can be obtained.

Figure 7:
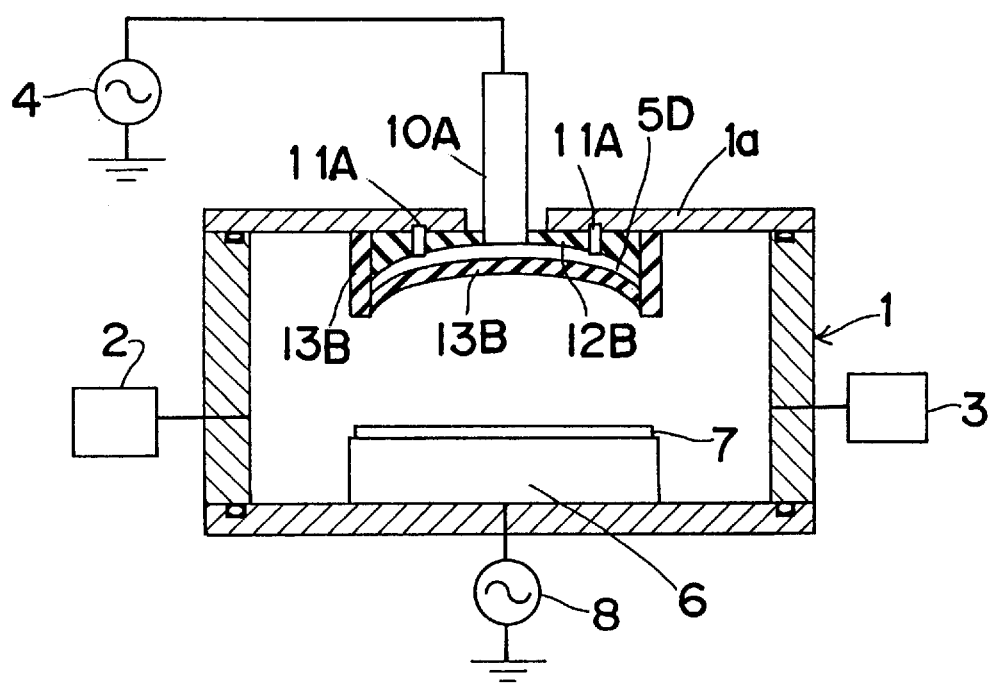
FIG. 7 is a sectional view showing the constitution of a plasma processing apparatus employed in a fourth embodiment of the present invention.
Figure 8:
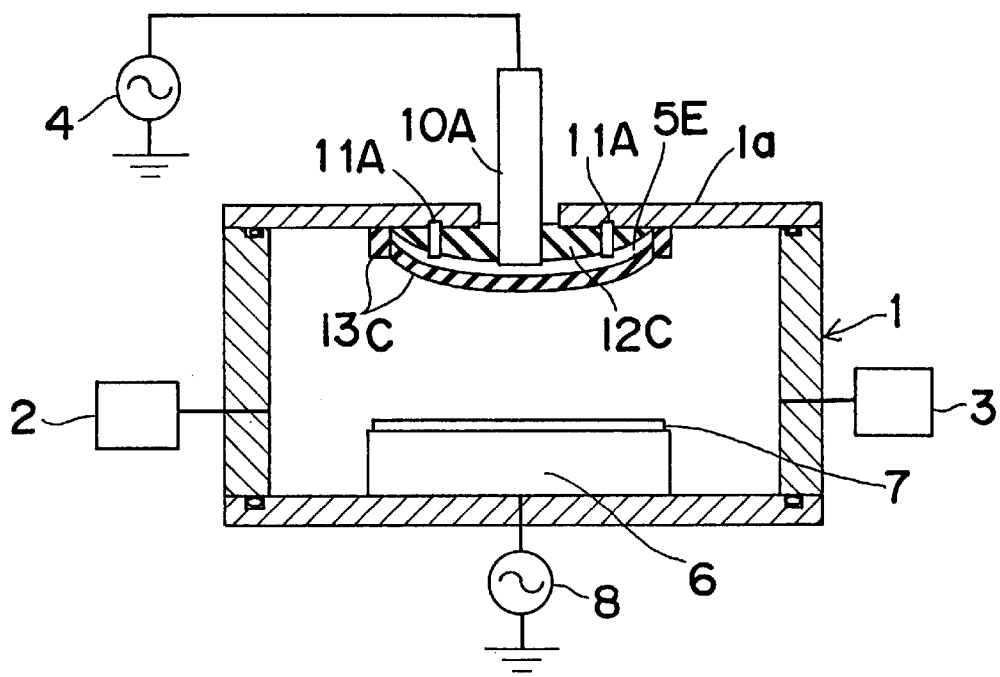
FIG. 8 is a sectional view showing the constitution of a plasma processing apparatus employed in a fifth embodiment of the present invention.

Also, the foregoing embodiments of the present invention have been described in a case where the antenna is flat-plate shaped. However, an antenna 5D may be formed into a dome shape convexed away from the substrate 7 with a dielectric 12B and an insulating cover 13B corresponding to the dielectric 12 and the insulating cover 13, respectively, as in a fourth embodiment of the present invention shown in FIG. 7. Instead, an antenna 5E may also be formed into a dome shape convexed toward the substrate 7 with a dielectric 12C and an insulating cover 13C corresponding to the dielectric 12 and the insulating cover 13, respectively, as in a fifth embodiment of the present invention shown in FIG. 8.

According to the fourth embodiment, when plasmoid is locally generated within the gas such as Ar, He, Xe which tends to move the plasma to the outside of the space just below the antenna 5D, the plasmoid may be held in a space just below the convex antenna 5D so as not to move to the outside of the space just below the antenna 5D, so that the plasma can be held between the antenna 5D and the substrate 7. It is preferable that the depth of the convex antenna is 10–30% of the diameter of the antenna, that is, supposing that a distance between the peripheral edge of the antenna is g2 and a distance between the center of the antenna is g1, a ratio (g2/g1) is from 0.7 to 0.9. The convex surface of the antenna is preferably a curved surface such as spherical or aspherical.

Figure 9:
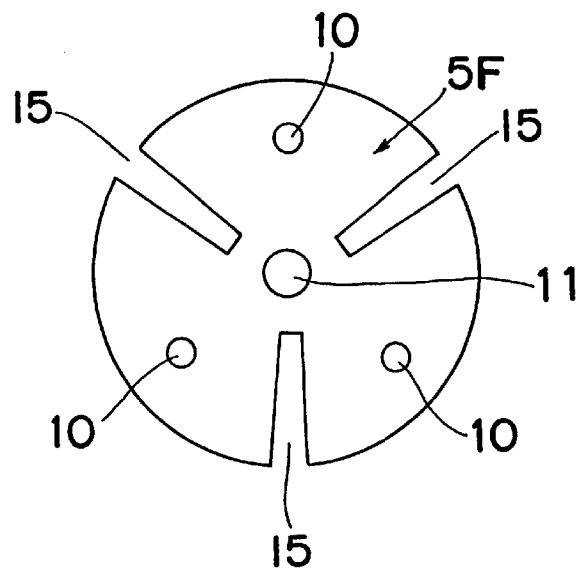
FIG. 9 is a plan view of an antenna employed in a sixth embodiment of the present invention.

Also, the foregoing embodiments of the present invention have been described on a case where no slots (cuts) are provided in the antenna. However, three slots 15 may be provided from the periphery of the antenna 5 towards the center of the antenna 5 as in a sixth embodiment of the present invention shown in FIG. 9. Three slots 15 are equidistantly spaced around the center of an antenna 5F so as to more surely obtain uniformity of plasma with each slot 15 located between the adjacent feed pins 10. Since the current of the $TM_{01}$ mode flows symmetrically about the center of the antenna 5 as shown in FIG. 3, the current flow is not blocked by the slots 15. On the other hand, the slots 15 have an effect of blocking the current on modes in which a current asymmetrical about the center of the antenna 5 flows, the slots 15 are effective in suppressing such modes.

Figure 12:
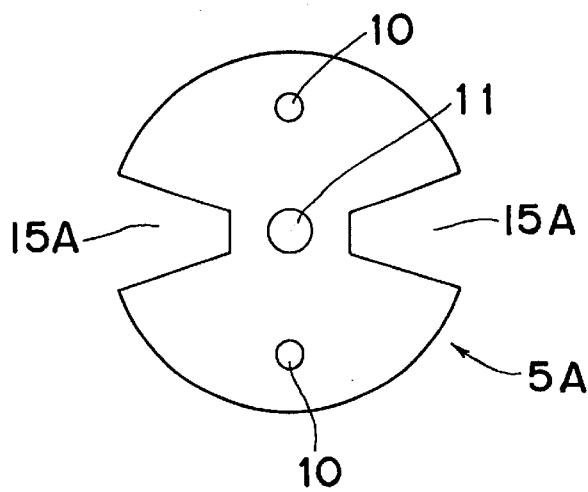
FIG. 12 is a plan view of an antenna employed in a first modification of the sixth embodiment of the present invention.
Figure 13:
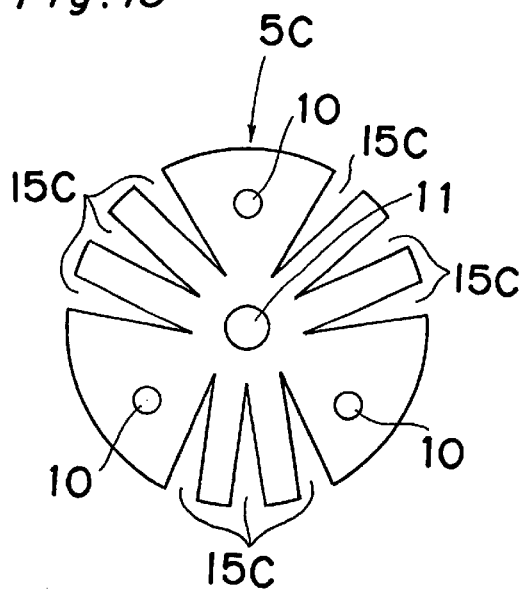
FIG. 13 is a plan view of an antenna employed in a second modification of the sixth embodiment of the present invention.
Figure 14:
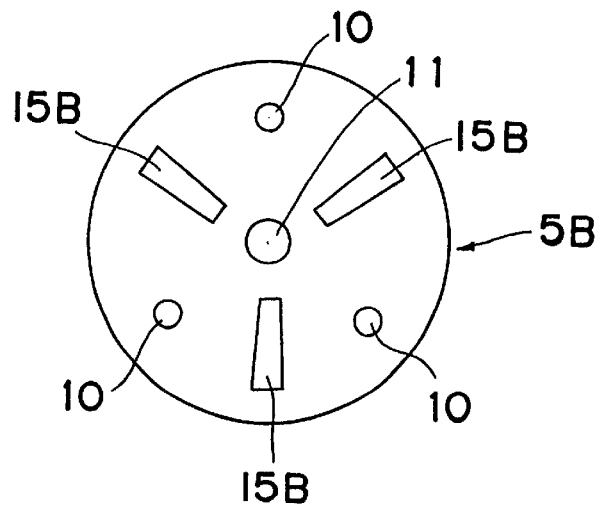
FIG. 14 is a plan view of an antenna employed in a third modification of the sixth embodiment of the present invention.

The number of slots is not limited to three, but may be two or four or more. For example, as shown in FIG. 12, two slots 15A are provided from the periphery of an antenna 5A towards the center of the antenna 5A. Alternatively, as shown in FIG. 13, three groups of slot sections each of which has three wedge-shaped slots 15C are provided from the periphery of an antenna 5C towards the center of the antenna 5C. Additionally, instead of the slot cut from the peripheral edge of the antenna, each slot may be made of a hole. For example as shown in FIG. 14, three slots 15B are provided from the periphery of an antenna 5B towards the center of the antenna 5B. Supposing that a total area of the slots is S1 and a total area of the antenna is S, it is preferable that the following equation is satisfied: $0<S_1<(S/10)$. Also it is preferable that each slot has the same area and the length of the slot is half of the radius of the antenna or more.

Also, the foregoing embodiments of the present invention have been described in a case where no DC magnetic fields are present within the vacuum chamber, for example, that is, neither a coil nor a permanent magnet for applying a DC magnetic field into the vacuum chamber is provided. However, the present invention is effective also for cases where there is no such large a DC magnetic field as to allow high-frequency power to penetrate into plasma, for example, a case where a small DC magnetic field of several tens of gauss is used for improvement in ignitability. Nonetheless, the present invention is particularly effective for cases where no DC magnetic fields are present in the vacuum chamber.

As apparent from the above description, according to a first aspect of the present invention, there is provided a plasma processing method for generating plasma within a vacuum chamber and processing a substrate placed on a substrate electrode within the vacuum chamber. The plasma is generated by supplying a high-frequency power having a frequency of 50 MHz to 3 GHz to an antenna provided opposite to the substrate while the interior of the vacuum chamber is controlled to a specified pressure by introducing a gas into the vacuum chamber and, simultaneously therewith, evacuating the interior of the vacuum chamber, wherein the substrate is processed. Meanwhile a general center of the antenna and the vacuum chamber are short-circuited to each other and the high-frequency power is fed to a site of the antenna other than its center and periphery. Therefore, by this plasma processing method, uniform plasma can be generated, so that the substrate can be processed uniformly.

Also, according to a second aspect of the present invention, there is provided a plasma processing method for generating plasma within a vacuum chamber and processing a substrate placed on a substrate electrode within the vacuum chamber. The plasma is generated by supplying a high-frequency power having a frequency of 50 MHz to 3 GHz to an antenna provided opposite to the substrate while the interior of the vacuum chamber is controlled to a specified pressure by introducing a gas into the vacuum chamber and, simultaneously therewith, evacuating the interior of the vacuum chamber, wherein the substrate is processed. Meanwhile a site of the antenna other than its center and periphery and the vacuum chamber are short-circuited to each other and the high-frequency power is fed to a generally center of the antenna. Therefore, by this plasma processing method, uniform plasma can be generated, so that the substrate can be processed uniformly.

Also, according to a third aspect of the present invention, there is provided a plasma processing apparatus. The plasma processing apparatus comprises a vacuum chamber, a gas supply device for supplying gas into the vacuum chamber, an evacuating device for evacuating interior of the vacuum chamber, and a substrate electrode for placing thereon a substrate within the vacuum chamber. The plasma processing apparatus also comprises an antenna provided opposite to the substrate electrode, and a high-frequency power supply for supplying a high-frequency power having a frequency of 50 MHz to 3 GHz to the antenna, wherein a general center of the antenna and the vacuum chamber are short-circuited to each other, and the high-frequency power is fed to a site of the antenna other than its center and periphery. Therefore, by this plasma processing apparatus, uniform plasma can be generated, so that the substrate can be processed uniformly.

Also, according to a fourth aspect of the present invention, there is provided a plasma processing apparatus. The plasma processing apparatus comprises a vacuum chamber, a gas supply device for supplying gas into the vacuum chamber, an evacuating device for evacuating interior of the vacuum chamber, a substrate electrode for placing thereon a substrate within the vacuum chamber, and an antenna provided opposite to the substrate electrode. The plasma processing apparatus also comprises and a high-frequency power supply for supplying a high-frequency power having a frequency of 50 MHz to 3 GHz to the antenna, wherein a site of the antenna other than its center and periphery and the vacuum chamber are short-circuited to each other, and the high-frequency power is fed to a generally center of the antenna. Therefore, by this plasma processing apparatus, uniform plasma can be generated, so that the substrate can be processed uniformly.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method comprising:
controlling an interior of a vacuum chamber to a specified pressure by introducing gas into the vacuum chamber and evacuating the interior of the vacuum chamber;
supplying high frequency power having a same phase and having a frequency of 50 MHz to 3 GHz to a plurality of sites of an antenna which are generally equidistantly spaced around a center of the antenna and other than at the center and a periphery of the antenna so as to more surely obtain uniformity of plasma, with the antenna provided opposite to a substrate in the vacuum chamber, wherein a general center of the antenna and the vacuum chamber are short-circuited to each other, while the interior of the vacuum chamber is controlled to the specified pressure; and
generating plasma within the vacuum chamber and processing the substrate placed on a substrate electrode within the vacuum chamber.

2. A plasma processing method according to claim 1, wherein the high-frequency power having the frequency of 50 MHz to 3 GHz is supplied to the antenna via a through hole provided at a site of a dielectric other than a center and a periphery of the dielectric, with the antenna provided within the vacuum chamber and with the dielectric sandwiched between the antenna and the vacuum chamber, wherein the antenna and the vacuum chamber are short-circuited to each other via a through hole provided at a general center of the dielectric.

3. A plasma processing method according to claim 1, wherein the high-frequency power having the frequency of 50 MHz to 3 GHz is supplied to the antenna with a surface of the antenna being covered with an insulating cover.

4. A plasma processing method according to claim 1, further comprising controlling plasma distribution on the substrate with an annular and recessed plasma trap provided between the antenna and the vacuum chamber while the substrate is processed.

5. A plasma processing method according to claim 1, further comprising blocking a current on modes in which a current asymmetrical about the center of the antenna flows with slots provided in the antenna from the periphery toward the center of the antenna while the high-frequency power having the frequency of 50 MHz to 3 GHz is supplied to the antenna.

6. A plasma processing method according to claim 1, wherein said generating of the plasma and said processing of the substrate within the vacuum chamber occur while no DC magnetic fields are present within the vacuum chamber.

7. A plasma processing method according to claim 1, wherein an area of the antenna is smaller than an area of the substrate.

8. A plasma processing method according to claim 2, wherein an area of the antenna is smaller than an area of the substrate.

9. A plasma processing method comprising:

controlling an interior of a vacuum chamber to a specified pressure by introducing gas into the vacuum chamber and evacuating the interior of the vacuum chamber;

supplying a high-frequency power having a frequency of 50 Mz to 3 GHz to a general center of an antenna with the antenna provided opposite to a substrate in the vacuum chamber, wherein a plurality of sites of the antenna other than a center and a periphery of the antenna are generally equidistantly spaced around the center of the antenna so as to more surely obtain uniformity of plasma and the vacuum chamber are short-circuited to each other, while the interior of the vacuum chamber is controlled to the specified pressure; and generating plasma within the vacuum chamber and processing the substrate placed on a substrate electrode within the vacuum chamber.

10. A plasma processing method comprising:

controlling an interior of a vacuum chamber to a specified pressure by introducing gas into the vacuum chamber and evacuating the interior of the vacuum chamber;

supplying a high-frequency power having a frequency of 5 MHz to 3 GHz to a general center of an antenna with the antenna provided opposite to a substrate in the vacuum chamber and with a dielectric sandwiched between the antenna and the vacuum chamber, the high-frequency power being supplied to the antenna via a through hole provided at a general center of the dielectric, wherein a site of the antenna other than a center and a periphery of the antenna and the vacuum chamber are short-circuited to each other via a through hole provided at a site of the dielectric other than a center and a periphery of the dielectric, while the interior of the vacuum chamber is controlled to the specified pressure; and generating plasma within the vacuum chamber and processing the substrate placed on a substrate electrode within the vacuum chamber.

11. A plasma processing apparatus comprising:

a vacuum chamber;

a gas supply device operable to supply gas into an interior of said vacuum chamber;

an evacuating device operable to evacuate the interior of said vacuum chamber;

a substrate electrode operable to have a substrate placed thereon within said vacuum chamber;

an antenna provided opposite to said substrate electrode; and a high-frequency power supply operable to supply high-frequency power having a frequency of 50 MHz to 3 GHz to said antenna, wherein a general center of said antenna and said vacuum chamber are short-circuited to each other, and the high-frequency power having a same phase is supplied to a plurality of sites of said antenna other than a center and a periphery of said antenna, said plurality of sites being generally equidistantly spaced around said center of the antenna.

12. A plasma processing apparatus according to claim 11, wherein a surface of said antenna is covered with an insulating cover.

13. A plasma processing apparatus according to claim 11, further comprising an annular and recessed plasma trap provided between said antenna and said vacuum chamber.

14. A plasma processing apparatus according to claim 11, wherein slots are provided in said antenna from said periphery toward said center of said antenna.

15. A plasma processing apparatus according to claim 11, wherein neither a coil nor a permanent magnet for applying a DC magnetic field into said vacuum chamber is provided.

16. A plasma processing apparatus according to claim 11, wherein said antenna is plate-shaped.

17. A plasma processing apparatus according to claim 11, wherein an area of said antenna is smaller than an area of said substrate.

18. A plasma processing apparatus comprising:

a vacuum chamber;

a gas supply device operable to supply gas into an interior of said vacuum chamber;

an evacuating device operable to evacuate the interior of said vacuum chamber;

a substrate electrode operable to have a substrate placed thereon within said vacuum chamber;

an antenna provided opposite to said substrate electrode;

a dielectric sandwiched between said antenna and said vacuum chamber; and a high-frequency power supply operable to supply high-frequency power having a frequency of 50 MHz to 3 GHz to said antenna, wherein a general center of said antenna and said vacuum chamber are short-circuited to each other via a through hole provided at a general center of said dielectric, and the high-frequency power is supplied to a site of said antenna other than a center and a periphery of said antenna via a through hole provided at a site of said dielectric other than a center and a periphery of said dielectric.

19. A plasma processing apparatus according to claim 18, further comprising a conductor operable to short circuit said general center of said antenna and said vacuum chamber to each other, wherein a size of said antenna, a dielectric constant of said dielectric, and a thickness of said conductor are so designed that an electromagnetic distribution of $TM_{01}$ mode is given to said antenna.

20. A plasma processing apparatus comprising:

a vacuum chamber;

a gas supply device operable to supply gas into an interior of said vacuum chamber;

an evacuating device operable to evacuate the interior of said vacuum chamber;

a substrate electrode operable to have a substrate placed thereon within said vacuum chamber;

an antenna provided opposite to said substrate electrode; and a high-frequency power supply operable to supply high-frequency power having a frequency of 50 MHz to 3 GHz to said antenna, wherein a general center of said antenna and said vacuum chamber are short-circuited to each other, and the high-frequency power is supplied to a site of said antenna other than a center and a periphery of said antenna, and wherein said antenna is formed into a dome shape convexed away from the substrate.

21. A plasma processing apparatus comprising:

a vacuum chamber;

a gas supply device operable to supply gas into an interior of said vacuum chamber;

an evacuating device operable to evacuate the interior of said vacuum chamber;

a substrate electrode operable to have a substrate placed thereon within said vacuum chamber;

an antenna provided opposite to said substrate electrode; and a high-frequency power supply operable to supply high-frequency power having a frequency of 50 MHz to 3 GHz to said antenna, wherein a general center of said antenna and said vacuum chamber are short-circuited to each other, and the high-frequency power is supplied to a site of said antenna other than a center and a periphery of said antenna, and wherein said antenna is formed into a dome shape convexed toward the substrate.

22. A plasma processing apparatus comprising:

a vacuum chamber;

a gas supply device operable to supply gas into an interior of said vacuum chamber;

an evacuating device operable to evacuate the interior of said vacuum chamber;

a substrate electrode operable to have a substrate placed thereon within said vacuum chamber;

an antenna provided opposite to said substrate electrode; and a high-frequency power supply operable to supply high-frequency power having a frequency of 50 MHz to 3 GHz to said antenna, wherein a site of said antenna other than a center and a periphery of said antenna and said vacuum chamber are short-circuited to each other, and the high-frequency power is supplied to a general center of said antenna.

23. A plasma processing apparatus according to claim 22, further comprising a dielectric sandwiched between said antenna and said vacuum chamber, wherein with said antenna provided within said vacuum chamber, the high-frequency power is supplied to said antenna via a through hole provided at a general center of said dielectric, and said antenna and said vacuum chamber are short-circuited to each other via a through hole provided at a site of said dielectric other than a center and a periphery of said dielectric.

24. A plasma processing apparatus according to claim 22, wherein said vacuum chamber is short-circuited to a plurality of sites of said antenna, said plurality of sites of said antenna at which said vacuum chamber is short-circuited being generally equidistantly spaced around said center of said antenna.

25. A plasma processing apparatus according to claim 23, further comprising a conductor operable to short circuit said general center of said antenna and said vacuum chamber to each other, wherein a size of said antenna, a dielectric constant of said dielectric, and a thickness of said conductor are so designed that an electromagnetic distribution of $TM_{01}$ mode is given to said antenna.

* * * * *